(12) United States Patent
Juliano et al.

(10) Patent No.: US 9,150,958 B1
(45) Date of Patent: Oct. 6, 2015

(54) APPARATUS AND METHOD OF FORMING A SPUTTERING TARGET

(75) Inventors: Daniel R. Juliano, Santa Clara, CA (US); Bao Nguyen, Sunnyvale, CA (US); Kedar Hardikar, Santa Clara, CA (US); Abdelouahab Ziani, Santa Clara, CA (US)

(73) Assignee: APOLLO PRECISION FUJIAN LIMITED, Quanzhou (CN)

( * ) Notice: Subject to any disclaimer, the term of this patent is extended or adjusted under 35 U.S.C. 154(b) by 681 days.

(21) Appl. No.: 13/355,565

(22) Filed: Jan. 23, 2012
(Under 37 CFR 1.47)

Related U.S. Application Data

(60) Provisional application No. 61/436,195, filed on Jan. 26, 2011.

(51) Int. Cl.
  *B30B 5/02* (2006.01)
  *B30B 9/22* (2006.01)
  *C23C 14/34* (2006.01)

(52) U.S. Cl.
  CPC ......... *C23C 14/3414* (2013.01); *B22F 2998/00* (2013.01)

(58) Field of Classification Search
  CPC .................................................... B30B 11/001
  USPC ................................................ 425/78, 405.2
  See application file for complete search history.

(56) References Cited

U.S. PATENT DOCUMENTS

| | | | |
|---|---|---|---|
| 3,184,528 A * | 5/1965 | Norwalk .................... | 425/405.2 |
| 3,902,544 A | 9/1975 | Flemings et al. | |
| 3,948,650 A | 4/1976 | Flemings et al. | |
| 4,089,680 A | 5/1978 | Flemings et al. | |
| 4,103,730 A | 8/1978 | Dussart | |
| 4,150,712 A | 4/1979 | Dussart | |
| 4,178,979 A | 12/1979 | Birat et al. | |
| 4,200,137 A | 4/1980 | Zavaras et al. | |
| 4,229,210 A | 10/1980 | Winter et al. | |
| 4,655,984 A * | 4/1987 | Hinton et al. .............. | 425/405.2 |
| 5,343,926 A | 9/1994 | Cheskis et al. | |
| 5,401,539 A | 3/1995 | Coombs et al. | |
| 5,699,850 A | 12/1997 | Beitelman et al. | |
| 6,070,643 A | 6/2000 | Colvin | |
| 6,165,413 A | 12/2000 | Lo et al. | |
| 6,478,842 B1 | 11/2002 | Gressel et al. | |
| 6,739,384 B2 | 5/2004 | Schoen et al. | |
| 7,544,884 B2 | 6/2009 | Hollars | |
| 8,147,736 B2 * | 4/2012 | Hayden et al. ............. | 425/405.2 |
| 2007/0007505 A1 | 1/2007 | Rastogi et al. | |
| 2007/0093059 A1 | 4/2007 | Basol | |
| 2008/0050263 A1 | 2/2008 | Ziani et al. | |
| 2008/0121137 A1 | 5/2008 | Van Osten et al. | |

(Continued)

OTHER PUBLICATIONS

U.S. Appl. No. 12/588,578, filed Oct. 20, 2009, Juliano et al.

*Primary Examiner* — Joseph S Del Sole
*Assistant Examiner* — Thukhanh T Nguyen
(74) *Attorney, Agent, or Firm* — The Marbury Law Group PLLC

(57) ABSTRACT

A method and apparatus for forming a sputtering target are provided that includes a copper indium gallium sputtering target material on a backing structure. The sputtering target is formed by compressing pre-alloyed and atomized powders of Cu, In, and Ga at pressures below 35,000 psi. In some embodiments the sputtering target material contains Na, S, or Se. In other embodiments the sputtering target is formed by isothermal compression.

15 Claims, 5 Drawing Sheets

(56) References Cited

U.S. PATENT DOCUMENTS

| | | |
|---|---|---|
| 2008/0145692 A1 | 6/2008 | Ziani |
| 2009/0277777 A1 | 11/2009 | Schultheis et al. |
| 2011/0089030 A1 | 4/2011 | Juliano et al. |
| 2011/0147208 A1 | 6/2011 | Goel et al. |

* cited by examiner

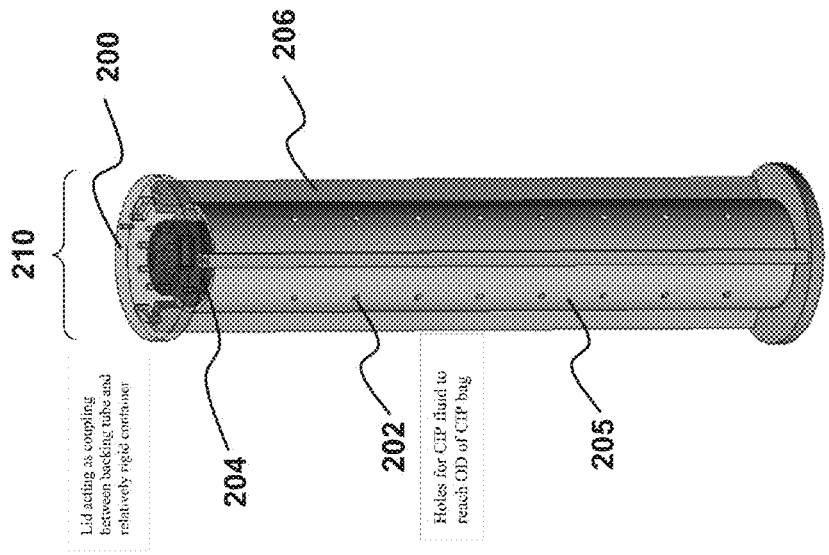
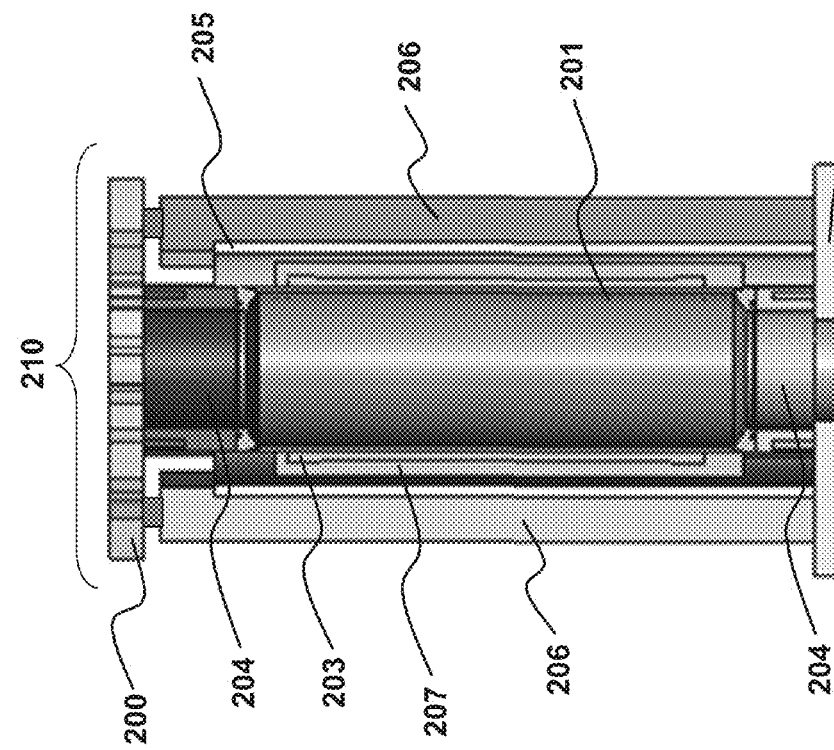
Fig. 2B
Fig. 2A

APPARATUS AND METHOD OF FORMING A SPUTTERING TARGET

CROSS REFERENCE TO RELATED PATENT APPLICATION

This application claims the benefit of U.S. Provisional Application No. 61/436,195 filed Jan. 26, 2011, incorporated herein by reference in its entirety.

FIELD OF THE INVENTION

The present invention relates generally to a method of making sputtering targets, and more specifically to forming a copper indium gallium sputtering target by compressing atomized powders.

BACKGROUND OF THE INVENTION

Copper indium diselenide (CuInSe2, or CIS) and its higher band gap variants copper indium gallium diselenide (Cu(In,Ga)Se2, or CIGS), copper indium aluminum diselenide (Cu(In,Al)Se2), copper indium gallium aluminum diselenide (Cu(In,Ga,Al)Se2) and any of these compounds with sulfur replacing some of the selenium represent a group of materials, referred to as copper indium selenide CIS based alloys, have desirable properties for use as the absorber layer in thin-film solar cells. To function as a solar absorber layer, these materials should be p-type semiconductors. This may be accomplished by establishing a slight deficiency in copper, while maintaining a chalcopyrite crystalline structure. In CIGS, gallium usually replaces 20% to 30% of the normal indium content to raise the band gap; however, there are significant and useful variations outside of this range. If gallium is replaced by aluminum, smaller amounts of aluminum are used to achieve the same band gap.

Sputtering techniques may be used for deposition of CIS based alloy layers, and one component of such sputtering techniques is a sputtering target. The combination of soft metal elements such as In and Ga along with harder metals such as copper and aluminum into a single sputtering target presents multiple challenges due to the presence of intermetallic phases, and there exists a need in the art to develop inexpensive techniques that can successfully combine such elements together into reliable sputtering target assemblies.

SUMMARY OF THE INVENTION

One embodiment of the invention provides a method of manufacturing a sputtering target assembly by compressing pre-alloyed Cu, In, and Ga powders having spherical or irregular particle shapes and that may contain large pieces of material such as shavings formed through machining of previously consolidated target materials. The step of consolidating the powders comprises pressing the powders at pressures below about 35,000 psi. The step of forming the pre-alloyed Cu, In, and Ga powders comprises atomization from a melt comprising a mixture of Cu, In, and Ga. In some embodiments the melt and powder contain doping elements such as Na, S, or Se.

Another embodiment of the invention provides a method of manufacturing a sputtering target assembly by compressing pre-alloyed and atomized Cu, In, and Ga powders onto a tubular backing structure or "backing tube" comprising pre-sputtered Cu, In, Ga alloy materials of the same or similar composition. The step of consolidation employs a structural extension piece affixed to the tubular backing structure to improve utilization of the consolidated target material. In another embodiment, the consolidation system employs a rigid structure that secures the backing tube in place during the step of consolidating. The step of consolidating further comprises a machining step to remove excess material at opposing ends of the consolidated target.

Another embodiment of the invention is an apparatus for consolidating sputtering target materials, comprising a backing structure inside a flexible container, a structural extension piece connected to the backing structure, an end cap connected to the structural extension piece, and a structural member connected to the end cap to provide mechanical support to the backing structure during consolidation of the target materials. In some embodiments, the apparatus comprises a center ring and a funnel for adding powder into the space between the backing structure and the flexible container.

BRIEF DESCRIPTION OF THE DRAWINGS

FIG. 2A is a schematic cross-sectional side-view of an assembly for consolidating pre-alloyed Cu, In, and Ga powders onto a tubular backing structure.

FIG. 2B is a schematic perspective view of an assembly for consolidating pre-alloyed Cu, In, and Ga powders onto a tubular backing structure.

DESCRIPTION OF THE EMBODIMENTS

Figure 1:
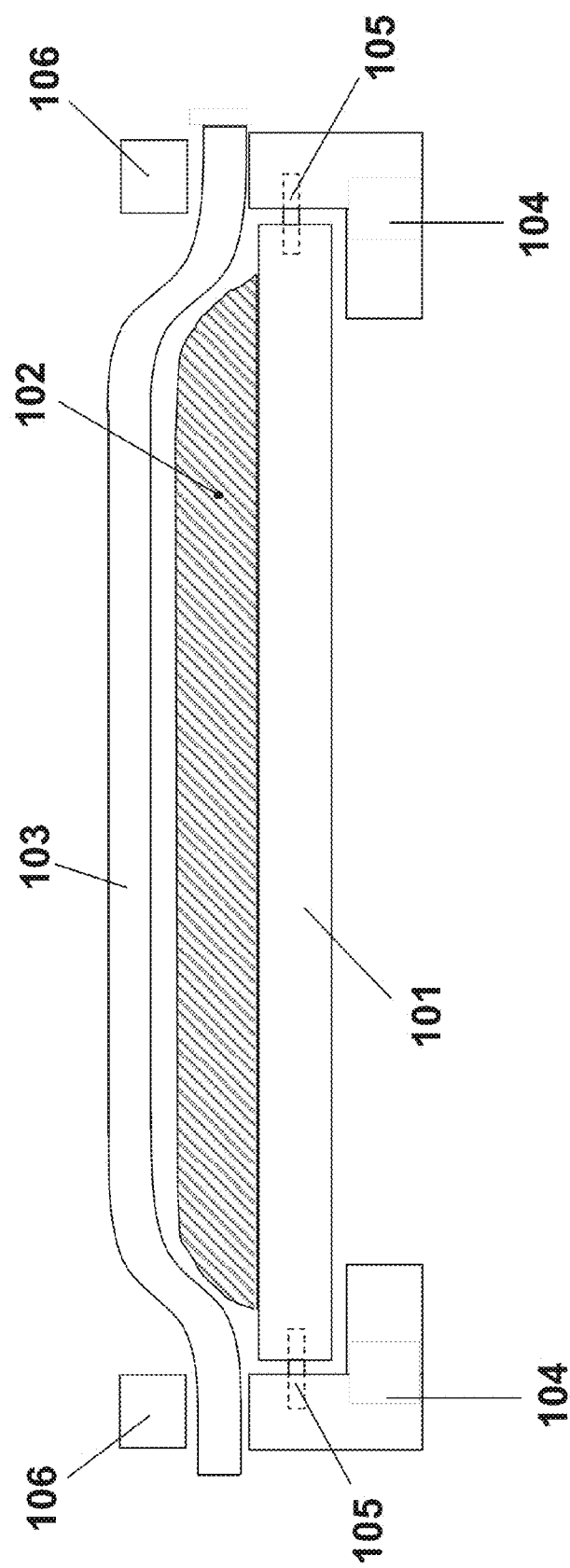
FIG. 1 is a schematic side cross-sectional view of an assembly for consolidating pre-alloyed Cu, In, and Ga powders into a sputtering target.

One consideration in selecting and developing sputtering targets is the material composition of the sputtering target material. Various materials that initially appear to be attractive selections impose manufacturing challenges, particularly the structural stability during consolidation of the material into a cylindrical or tubular shape. Another consideration is that certain monolithic targets formed without a backing tube are not adequate to accommodate water cooling, which is normally provided to the magnets and target assembly during sputtering operations. As a result, sputtering materials are often bonded to a backing tube or directly formed onto a backing tube structure, such as a backing tube made from stainless steel or other suitable structural materials.

An exemplary sputtering technique is magnetron sputtering which utilizes magnetrons. Examples of such magnetron sputtering techniques, such as planar magnetron sputtering and rotary magnetron sputtering are discussed in U.S. Pat. No. 7,544,884, issued on Jun. 9, 2009, and which is hereby incorporated by reference in its entirety.

Rotary magnetron sputtering uses cylindrical shaped sputtering targets and at least one magnet located inside the tube. Due to the continuous displacement of the magnetic flux lines running through the tube wall as the tube is rotated around the magnets, circumferentially uniform erosion is achieved at the surface of the sputtering target. Such an erosion profile results in higher utilization of the target material in comparison to the erosion profiles provided by other sputtering techniques, such as those employing stationary, planar magnetrons.

One example of a sputtering application is the deposition of materials for solar cells. Copper indium selenide ("CIS") and copper indium gallium selenide ("CIGS") materials have been recognized as effective p-type solar cell absorber layer materials for the production of high efficiency, low cost, and large scale solar cells. Copper indium selenide and copper indium gallium selenide materials may be formed by a reactive sputtering from a copper indium or copper indium gallium ("CIG") sputtering targets, respectively, in a selenium containing ambient such as evaporated selenium gas or hydrogen selenide gas. In other embodiments, metallic CIG layers may be deposited at reduced substrate temperatures below 400° C., and the metallic films may be converted into CIGS materials by a separate annealing step in a selenium containing ambient.

CIG alloys are understood to possess a large freezing range, with a liquidus temperature over 500° C., often around 650° C., and a solidus temperature of below °160 C. A significant volume change is associated with the solidification and thermal contraction that occurs over such a wide temperature range. Thus, a substantial amount of shrinkage occurs during solidification of such alloys. Sputtering targets, long in one dimension with narrow sections and thin walled features, for example, may have porosity due to this extensive solidification shrinkage. Inclusions and structural defects, such as voids and porosity, are detrimental to sputtering processes, because such defects can cause arcing and electrical discharges that result in particle generation and the development of thin film anomalies. Phase heterogeneities, such as large areas rich in indium or copper, are also detrimental to the sputtering process so it is desirable for the target material to possess a fine-scale microstructure, which may be obtained by employing sufficiently rapid cooling during solidification. In addition, large scale variations of composition within a target can lead to sputtered thin films of variable properties across their area and, as a consequence, reduced yield, so the method of CIG target production must limit the amount of macroscopic segregation of constituent elements. For example, the embodiments of the present invention provide methods of forming a copper indium gallium ("CIG") alloy sputtering target material. The CIG sputtering target material may be formed directly onto a backing structure, such as a cylindrical backing tube. Alternatively, CIG segments may be formed separately and then bonded to the backing tube.

One embodiment of this invention provides a method of manufacturing a sputtering target assembly by compressing pre-alloyed Cu, In, and Ga (CIG) powders with spherical or irregular particle shapes. The powder may optionally contain larger pieces of material such as shavings formed from the machining of previously consolidated target materials. The step of consolidating advantageously comprises pressing the powders at relatively low pressures, such as pressures below about 35,000 psi. In other embodiments, the step of consolidating comprises pressing powders at pressures below about 29,000 psi, or more advantageously at below 25,000 psi. The step of forming the pre-alloyed CIG powders comprises atomization from a melt comprising a mixture of CIG. In some embodiments the melt and powder contain doping elements such as Na, S, or Se.

Another embodiment of this invention provides a method of manufacturing a sputtering target assembly by compressing pre-alloyed and atomized CIG powders onto a tubular backing tube comprising spent or previously used CIG alloy materials of the same or similar composition. Spent CIG alloy materials include those portions that remain on a tubular backing tube at the end of a deposition process. Generally, sputtering target materials are not completely consumed during a deposition process, and sputter target forming methods of the prior art require stripping the unused materials from the backing tube before a new sputtering target can be formed thereon, which can be expensive and laborious. In one embodiment of this invention, the step of consolidation employs a structural extension piece affixed to the tubular backing structure to improve utilization of the consolidated target material by allowing new target material to be added to a partially used, tubular sputtering target. In some embodiments, step of consolidating further comprises a machining step to remove excess material at opposing ends of the consolidated target.

Another embodiment of this invention provides a method of manufacturing a sputtering target assembly by compressing pre-alloyed and atomized CIG powders onto a tubular backing tube comprising "spent" or partially pre-sputtered CIG alloy materials of the same or similar composition. The step of consolidation employs a structural extension piece affixed to the tubular backing structure to improve utilization of the consolidated target material. The step of consolidating further comprises a machining step to remove excess material at opposing ends of the consolidated target.

Another embodiment of this invention provides a method of manufacturing a sputtering target assembly by compressing pre-alloyed CIG powders that may have spherical or irregular particle shapes, and optionally contain larger pieces of material such as shavings formed by the machining of previously consolidated target materials. In some embodiments the step of consolidating powders further comprises isothermal forming at pressures below about 35,000 psi. The pre-alloyed CIG powders are formed by atomization from a melt comprising a mixture of CIG. In some embodiments the melt and pre-alloyed CIG powder contain doping elements such as Na, S, or Se, in order to improve the conversion efficiency of CIGS solar cells made from the sputtering targets.

FIG. 1 shows a schematic cross-sectional side view of one side of an apparatus for isothermal forming according to one embodiment of the invention. Backing tube 101 provides a support structure for sputtering target material 102. Flexible container 103 provides a barrier between the compressive forces of the transfer medium (not shown) and the target material 102. Clamps 106 hold the flexible container in position and prevent the sputtering target material 102 from exiting at the ends of the backing tube support structure due to the consolidation pressures. In some embodiments, extension clamps 104 are affixed to backing tube 101 using screws, pegs, or fasteners 105. The extension clamps are advantageously employed to allow the sputtering target material to more fully extend the length of the backing tube while allowing sufficient room to secure the flexible container using clamps 106.

In other embodiments, isothermal die forming is employed, and the backing structure is supported against the stationary portion of a die tool, or against a mandrel if the backing structure is a tube. In certain embodiments, the powder may be filled directly into the die tool or encapsulated around the tubular backing structure. As shown in FIG. 1, flexible container 103 may be comprised of soft materials such as moldable polyurethane, latex, or a thin sheet of aluminum, copper, titanium, or molybdenum. The flexible encapsulation material may also be used in an apparatus for isostatic pressing, where a backing structure such as a tube, mandrel, or incompressible filler material may be used for support. Alternatively, the flexible encapsulation can be designed such that the inner diameter of the tube remains open for the pressurized medium to fill the inner portion of the backing structure in order to maintain equal pressure on both sides of the backing structure to avoid crushing the tubular structure, while allowing for relatively high pressures to be directed only onto the CIG or other target material being consolidated.

When isothermal forming is employed, the inner chamber formed by flexible container 103 and the powdered CIG material 102 are evacuated to a vacuum pressure of 10 mTorr, with a leak-up rate of preferably less than 1,000 mTorr/min, and even more preferably less than 100 mTorr/min, in order to prevent air entrapment and rupture of the flexible container that may result from pressure increases during isothermal forming at elevated temperatures. The inventors have found that isothermal forming is particularly advantageous for CIG powders comprising a low copper content, such as CIG powders with an atomic ratio of copper to indium plus gallium, also known as the ratio of copper to the sum of group III elements or "Cu/III ratio" of less than about 0.5. Powders having a Cu/III ratio of less than about 0.5 are often sticky and agglomerate easily, leading to poor flow and handling characteristics, which makes classification of the powder into size fractions very difficult.

In certain embodiments, CIG powders are manufactured through atomization, using techniques that would be known to one of skill in the art. When the consolidation methods described herein are employed, the morphology of the source powders may be spherical or irregular without deleteriously affecting the quality of the consolidated CIG target material in certain embodiments. Larger pieces of CIG material may be included in the powder mixture, such as shavings created during machining of previously consolidated CIG target materials. For example, shavings may have dimensions of 1 mm to 1 cm in width and from 1 mm to 20 cm in length depending on the settings of the lathe or other machine tool employed. The lathe settings that may be adjusted include the blade dimensions, cut angle, turn speed, and feed rate, which may be adjusted individually or in combination in order to alter the sizes of shavings produced during machining of CIG target materials. In some embodiments the powder and shavings are consolidated by isothermal forming into segments that are subsequently bonded onto a backing structure, such as a rotary backing tube or a planar backing plate. In other embodiments, the powder and shavings are consolidated directly onto the rotary or planar backing structure.

FIG. 2A shows a cross-sectional side-view of an apparatus for isothermal forming according to another embodiment of the invention. Consolidation system 210 comprises components that improve the density and uniformity of consolidated materials. For example, backing tube 201 provides structural support for the target material during consolidation, and backing tube extension 204 is secured to the backing tube at one end, and additionally secured to coupling lid 200 using the same or similar fasteners, for example screws, pegs, or clamps. Coupling lid 200 functions to secure the backing tube within fill cavity 203, and allows a portion of the non-uniform forces created during consolidation of the target material to transfer away from the backing tube to the outer stiffening bars 206. In this embodiment, stiffening members 206 run down the length of the consolidation system and transfer mechanical forces between coupling lids 200 and the outer shell 205, which serves to provide mechanical support to flexible container 207. The stiffening members and outer shell may be comprised of various structural metals such as aluminum, steel, titanium, brass or other mechanically rigid metals. The consolidation system of FIG. 2A functions to hold the backing tube securely in place relative to sputtering target material and advantageously transfers forces from the target material to the backing tube and finally, to the rigid stiffening members to avoid latent mechanical stresses in the sputtering target assembly after the sputtering target consolidation step is completed.

Figure 4:
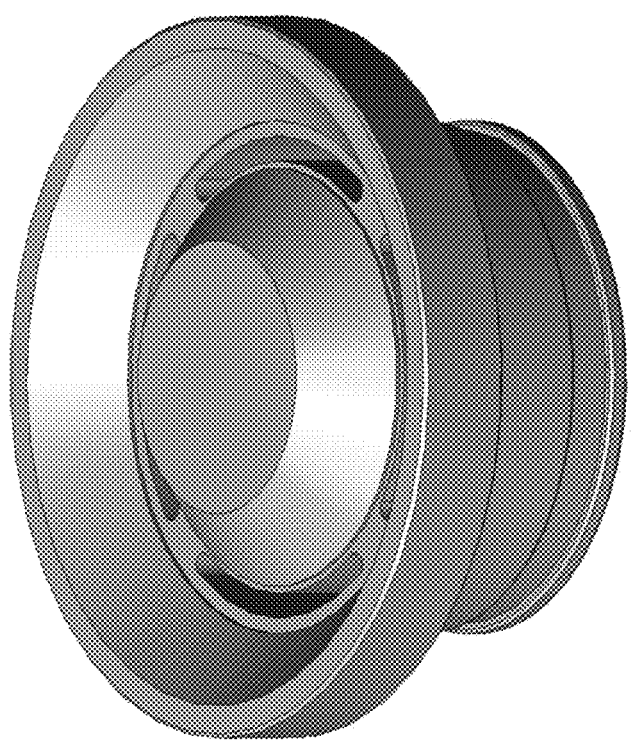
FIG. 4 is a perspective view of a combined end cap and funnel for providing powders into an assembly for consolidating sputtering target materials.

FIG. 2B is a perspective view of a consolidation system that more readily indicates the arrangement of some of the parts shown in FIG. 2A. Outer shell 205 runs down the length of the consolidation system and provides mechanical support to the flexible container (not shown) that is disposed against the inner diameter of outer shell 205. The outer shell typically surrounds the flexible container, but it need not completely encircle or envelope it in order to provide mechanical support, for example the ends or other portions of the flexible container may not be surrounded by the outer shell at all. In some embodiments, holes 202 run down the length of the outer shell to allow a pressure transfer medium such as air, nitrogen, argon, water, or other commonly employed pressure transfer mediums to reach the outer diameter of the flexible container and provide the necessary consolidation forces to the powder, which is then compressed to form the sputtering target material. In certain embodiments, the step of consolidating comprises pressurizing the transfer medium and thus the powders at relatively low pressures, such as pressures below about 35,000 psi in order to avoid high mechanical stresses on the consolidation system and reduces the chances of deforming the backing tube. In other embodiments, the step of consolidating comprises pressing powders at pressures below about 29,000 psi, more advantageously at below about 26,000 psi, and even more advantageously below about 22,000 psi. Optionally, a funnel adaptor shown in FIG. 4 may be employed to center the flexible container around outer shell 205, and to provide a funnel feature for improved uniformity when filling the powdered target materials into fill cavity 203.

Figure 3:
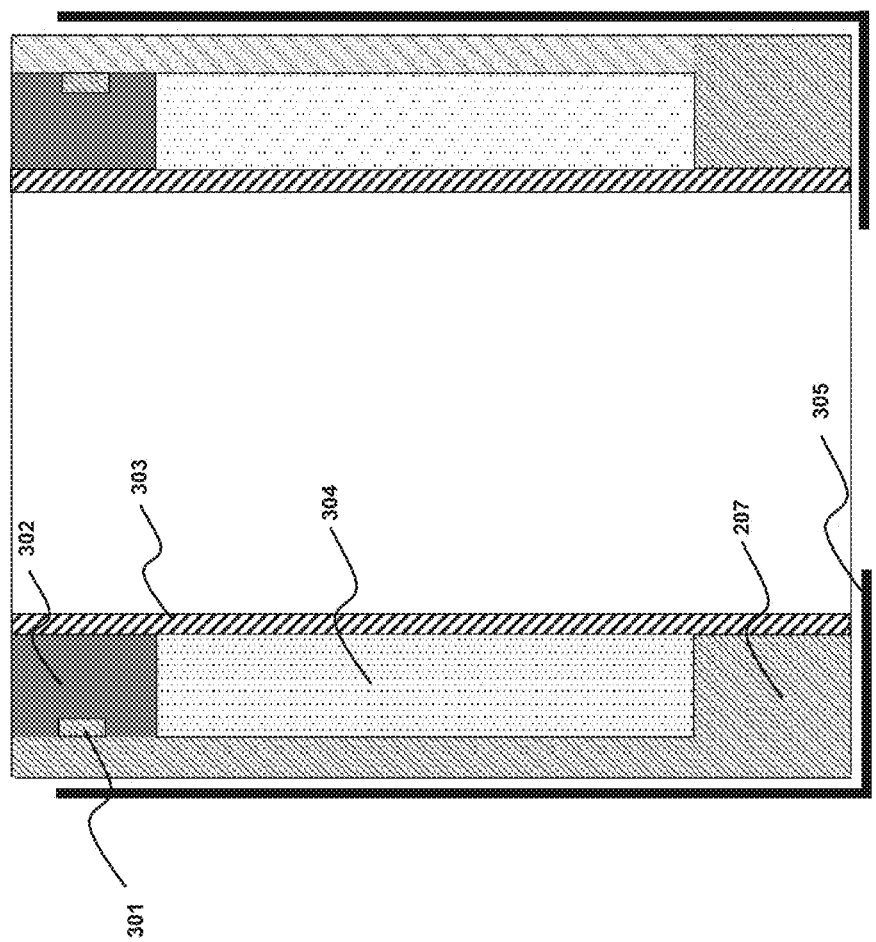
FIG. 3 is a schematic cross-sectional side-view of an assembly for consolidating pre-alloyed Cu, In, and Ga powders onto a tubular backing structure.

FIG. 3 shows close-up cross-sectional side view of a consolidation system according to another embodiment of the invention. Backing tube 303 provides mechanical support to the target material 304, which is initially introduced into the consolidation system as a powder or a combination of powder and shavings or other non-uniformly shaped particles. Flexible support 207 is secured against the target material by outer shell 305.

In this embodiment, the pressure transfer medium comprises a fluid, gas, or other viscous material that is maintained at the required forming temperature by means of an external heating system (not shown), such as conduction based resistance heating coils. The temperature of the pressure transfer medium may be held above 200° C., for example 250° C. In other embodiments the temperature may be held at 400° C., and adjusted upwards as the copper content of the CIG alloy powder increases in some embodiments. In other embodiments, isothermal forming of CIG target materials may be performed at or near room temperature (25° C.). Pressure transfer mediums such as water may be used at lower isothermal forming temperatures, and inert gasses such as argon may be used for elevated temperatures above 100° C. Advantageously, isothermal forming creates a uniform flow of the sputtering target material 102 and significantly reduces the development of residual forming stresses.

In some embodiments, the CIG alloy powders are produced by atomizing pre-alloyed melts of the same composition. An example atomization tool is found in U.S. Pat. No. 6,423,113, which is incorporated by reference herein in its entirety. In other embodiments, CIG powders are formed by high-energy powder milling or cryomilling of alloy particles of CIG metal. Powdered materials formed in this way are chemically more homogeneous than CIG powder blends comprising multi-component particles (e.g. separate In and CuGa powders), and this eliminates the risk of preferential flow of the softer material components such as indium during consolidation. The addition of sodium or other alkali metals may be achieved by mechanically alloying CIG powders with an alkali containing salt, for example using a ball mill. In certain embodiments, a powder flow agent such as Cab-o-Sil® or other silica-based flow agents are employed to prevent powder agglomeration. In other embodiments, low temperature ball milling (e.g. cryomilling) is employed by using liquid nitrogen or frozen $CO_2$ cooling systems to reduce the temperature of the power during milling. In an example embodiment, sodium incorporation is achieved by alloying indium and an alkali containing salt, and then combining this alloy with a CIG powder to form the precursor mix before target consolidation. In yet another embodiment, sodium metal is combined with gallium to form a relatively stable composition containing intermetallic compounds such as $Ga_4Na$, which is then formed into a powder and combined with the remaining CIG materials. The stability of the $Ga_4Na$ powder may optionally be improved by coating the powder with a thin layer of Cu, In, Ga, Se, or alloys thereof. For example, such a coating may be applied during the step of atomizing by performing the atomization in an environment comprising an elemental vapor, such as by introducing metal vapors through a secondary gas manifold near the atomization die. Metal powder coatings may optionally be applied using organometallic CVD precursors such as Bis(u-dimethylamino)tetrakis(dimethylamino)digallium or Trimethylphosphine(hexafluoroacetylacetonato)copper(I) in a CVD reaction chamber, or in a fluidized bed reactor.

In some embodiments, the backing structure may be a spent target assembly comprising a used backing structure and partially used sputtering target material. This advantageously provides an economical way to refurbish spent targets. In a preferred embodiment, the spent sputtering target materials may require some treatment before reuse, such as removing contamination picked up during processing and handling, or trimming the remaining target material to a shape more advantageous for subsequent isothermal pressing. Contamination removal may include heating the spent materials in a hydrogen containing atmosphere to remove oxidation, or mechanically removing surface layers that may comprise contaminant materials.

In embodiments where the CIG powder is consolidated directly onto an unused backing structure, the backing structure may require some preparation in order to form an appropriate bond with the CIG powder and consolidated CIG material. Examples of operative preparations include one or more of surface roughening by bead blast, application of a rough bond coat layer such as a thermal spray, for example NiCr, CuAl, or similar thermal spray coatings. Other coatings include layers that may chemically bond to the CIG layer such as indium based layers, including indium-bismuth, indium-tin, indium-bismuth-tin, and tin-bismuth. Optionally, harder materials such as Cu or CIG applied by cold spray are employed to improve bonding to the backing structure. The chemical bonding layer may be applied or processed at a temperature above its melting point to enhance bond formation with the backing structure or the bond coat layer beneath it. When the CIG powder is subsequently applied it tends to form a favorable diffusion bond with this layer, even when maintaining a temperature below the melting points of the chemical bond layer and/or the CIG. This feature is particularly important for CIG powders having low copper contents and therefore low melting points, since it is generally, though not always, infeasible to heat the substrate enough to melt the bond layer without also causing melting in the CIG material.

Chemical bond layers may optionally be used to bond the CIG alloy to a backing structure directly during the pressing process, and may also be used to solder bond CIG segments that have been separately consolidated by pressing, casting, spraying, or other consolidation techniques. In these embodiments it is preferable that the melting point of the bonding material be lower than the solidus of the CIG material to prevent the CIG from melting during the bonding process.

Figure 5:
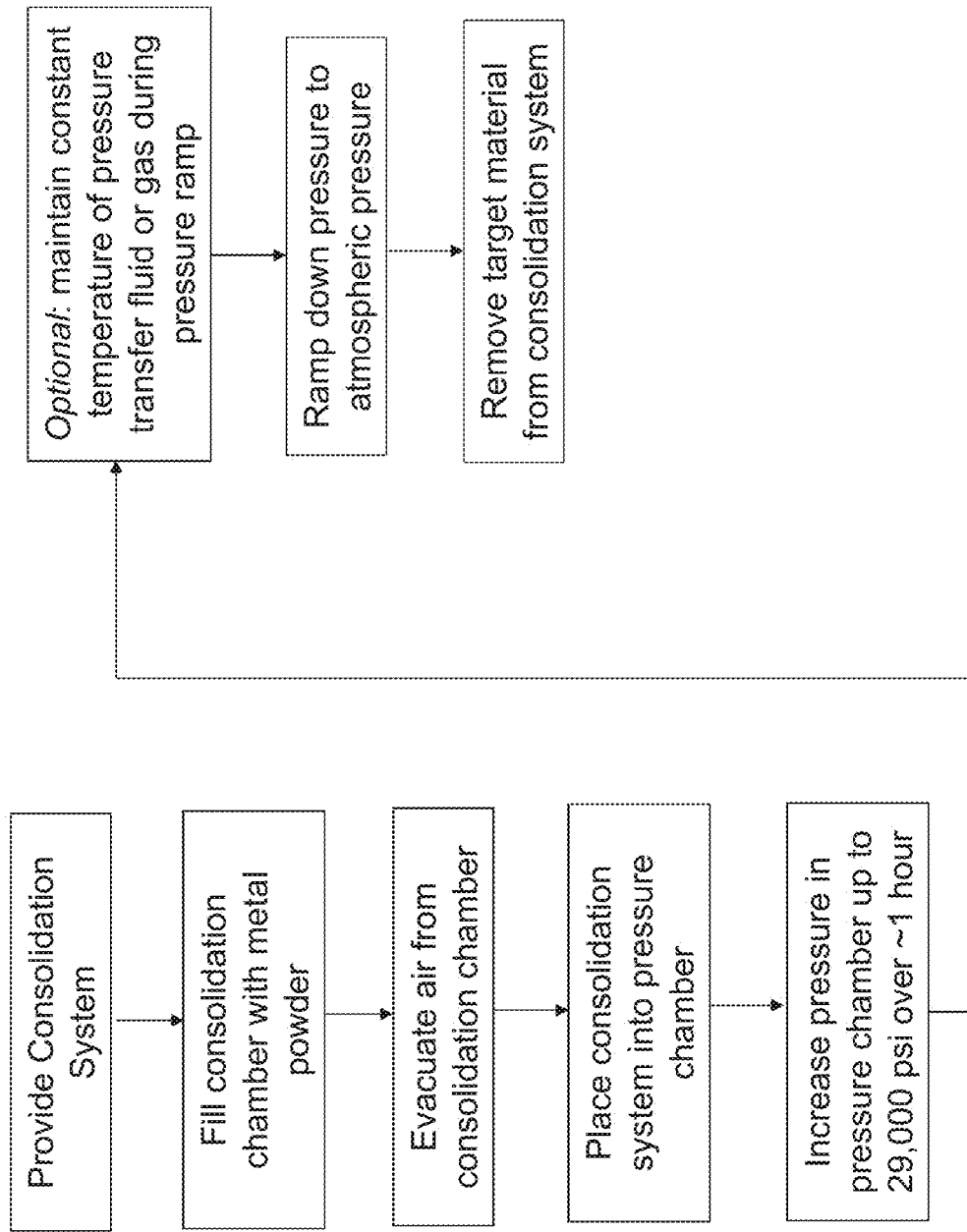
FIG. 5 is a flow diagram illustrating certain operations in a method of fabricating a sputtering target using consolidation apparatus.

FIG. 5 is a process flow diagram for a method of forming a sputtering target using an apparatus in one embodiment of the invention. First a consolidation system of the type shown in FIG. 2 is provided, which is then filled with metal powders that will form the sputtering target. The air is then evacuated from consolidation chamber 203, and the apparatus is placed into a pressure chamber or otherwise immersed in a pressure transfer medium. In some embodiments, the pressure may be increased up to as high as 35,000 psi, for example 30,000 psi, 27,000 psi, 22,000 psi, or 17,000 psi in some embodiments. The pressure is increased slowly, for example during a time of 10 minutes to 2 hours. Optionally, the temperature of the pressure transfer medium may be maintained at a constant value during the increase in pressure in order to provide greater control over the mechanical stresses in the consolidated target material. Upon reaching the maximum pressure, the system may be immediately ramped down, or for materials that rely on creep to improve the consolidation density, may be held at the maximum pressure for a period of up to 5 hours. The pressure is then ramped down to atmosphere and the consolidated target is removed from the apparatus. Optionally, the target may undergo an additional machining step to form the target to a precise shape.

In some embodiments, after the consolidation process has been completed, the entire sputtering target assembly may be heated or annealed at elevated temperature to improve the material properties, bonding strength, or density. For example, the sputtering target assembly may be heated to 150° C. for approximately 30 minutes in order to increase the bond strength between the sputtering target and the backing structure. The amount of time and temperature required to improve the bond strength cannot be easily defined across all target material and bond material compositions, but the soak temperature is typically below the melting point of the bond material to avoid completely losing the bond integrity, and the temperature should be below the melting point of the sputtering material as well to avoid gross deformations.

It is to be understood that the present invention is not limited to the embodiment(s) and the example(s) described above and illustrated herein, but encompasses any and all variations falling within the scope of the appended specification. For example, as is apparent from the specification, not all method steps need be performed in the exact order illustrated or claimed, but rather in any order that allows the proper formation of the sputtering targets of the present invention.

What is claimed is:

1. An apparatus for forming a sputtering target, comprising:
   a flexible container;
   a cylindrical sputtering target backing structure within the flexible container;
   a sputtering target material powder fill cavity located between the flexible container and the cylindrical sputtering target backing structure;
   an outer shell surrounding the flexible container;
   holes extending through a cylindrical sidewall of the outer shell to the outer diameter of the flexible container which allow a pressure transfer medium to reach the outer diameter of the flexible container and provide consolidation forces to the sputtering target material powder fill cavity;

a first end cap; and a stiffening member, wherein the first end cap is operatively connected to the backing structure, and the stiffening member is operatively connected to the first end cap to provide mechanical support.

2. The apparatus of claim 1, wherein the pressure transfer medium is selected from the group consisting of air, argon, nitrogen, oxygen, and mixtures thereof.

3. The apparatus of claim 1, wherein the pressure transfer medium is selected from the group of consisting of water, synthetic aromatic oil, organic oil, inorganic oil, mineral oil, acetone, and ethylene glycol.

4. The apparatus of claim 1, wherein the flexible container is selected from the group consisting of moldable polyurethane, latex, copper, aluminum, titanium, and molybdenum.

5. The apparatus of claim 1, further comprising a centering ring for the backing structure that comprises a funnel for adding powder materials into the space between the flexible container and the backing structure.

6. The apparatus of claim 5, further comprising at least one backing structure extension piece affixed to one end of the backing structure.

7. The apparatus of claim 5, further comprising a second end cap connected to the distal end of the backing structure, and further wherein the stiffening member is connected to the first end cap and the second end cap.

8. The apparatus of claim 5, further comprising a second end cap and a second backing structure end piece, and further wherein the second end cap is connected to the second backing structure extension piece and the stiffening member is connected to the first end cap and to the second end cap.

9. The apparatus of claim 1, further comprising a pressure transfer medium located between the outer diameter of the flexible container and the outer shell.

10. The apparatus of claim 9, wherein the pressure transfer medium is pressurized to 5,000 to 35,000 psi.

11. The apparatus of claim 9, wherein a sputtering target material powder is located in the sputtering target material powder fill cavity.

12. The apparatus of claim 11, wherein the sputtering target material powder comprises pre-alloyed particles comprising copper indium and gallium.

13. The apparatus of claim 12, wherein the pre-alloyed copper indium gallium particles comprise irregularly shaped copper indium gallium shavings formed from machining previously consolidated copper indium gallium sputtering targets.

14. The apparatus of claim 12, wherein the pre-alloyed copper indium gallium powder has an atomic ratio of copper to indium plus gallium of less than about 0.5.

15. The apparatus of claim 9, wherein a compressed copper indium gallium sputtering target material layer is located on the backing structure in the sputtering target material powder fill cavity.

* * * * *